United States Patent [19]

Hsu et al.

[11] Patent Number: 4,797,631
[45] Date of Patent: Jan. 10, 1989

[54] FOLDED CASCODE AMPLIFIER WITH RAIL-TO-RAIL COMMON-MODE RANGE

[75] Inventors: Wei-Chan Hsu, Plano; William R. Krenik, Dallas; James R. Hellums, Arlington, all of Tex.

[73] Assignee: Texas Instruments Incorporated, Dallas, Tex.

[21] Appl. No.: 124,694

[22] Filed: Nov. 24, 1987

[51] Int. Cl.$^4$ .................................... H03F 3/45
[52] U.S. Cl. .................................. 330/253; 330/255; 330/258; 330/260; 330/311
[58] Field of Search ............... 330/253, 255, 258, 260, 330/311

[56] References Cited

U.S. PATENT DOCUMENTS 4,638,260 1/1987 Hamley .......................... 330/260 X Primary Examiner—James B. Mullins
Attorney, Agent, or Firm—Richard G. Coalter; Leo N. Heiting; Melvin Sharp

[57] ABSTRACT

A folded cascode amplifier with rail-to-rail common-mode range utilizes a fully differential input with two sets of input common source amplifier devices to allow rail-to-rail common-mode range. The first set of devices utilizes N-channel transistors (28) and (32) to provide operation in one direction and P-channel transistors (38) and (42) to allow operation in the other direction. Two common gate amplifier output legs are provided for generating a differential voltage between an output node (50) and an output node (48) in a cascode configuration. A feedback circuit is provided for maintaining node (50) at analog ground over the full common-mode range of the input voltage. The feedback circuit utilizes a current source with transistors (88) and (90) and a differentially configured set of transistors (80) and (82) to control a feedback transistor (86). The feedback transistor (86) controls the current in both of the output legs to maintain the node (50) at analog ground by receiving at one of the differential inputs the voltage on the node (50) and comparing it with analog ground on the other differential input.

13 Claims, 1 Drawing Sheet

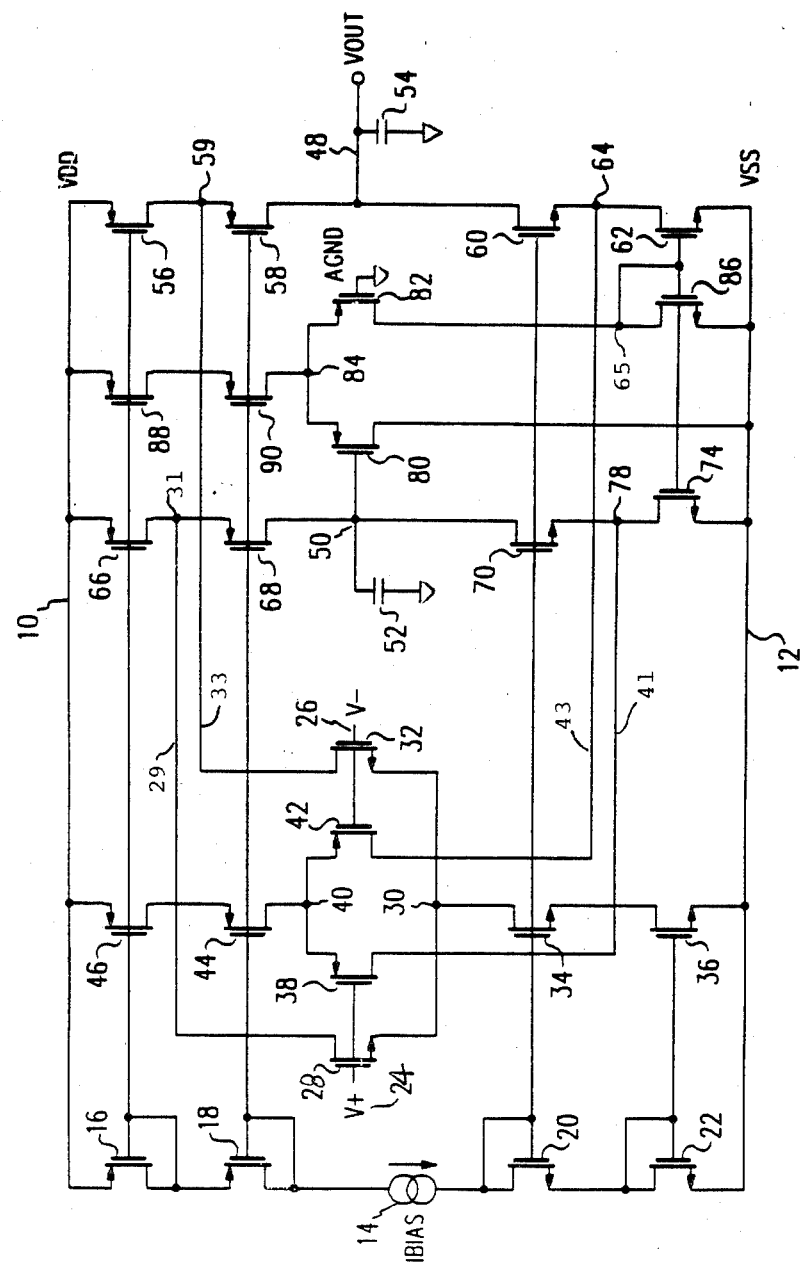

4,797,631

FOLDED CASCODE AMPLIFIER WITH RAIL-TO-RAIL COMMON-MODE RANGE

TECHNICAL FIELD OF THE INVENTION

The present invention pertains in general to a folded cascode amplifier, and, more particularly, to a folded cascode amplifier using CMOS technology with rail-to-rail common mode range on the input with a single ended output.

BACKGROUND OF THE INVENTION

Operational ampifiers have seen widespread application in recent years. One of the major challenges to designers of operational amplifiers has been providing a suitable compromise on design parameters to yield an amplifier that can be utilized in multiple applications. One parameter of an operational amplifier, common-mode range, tends to present a major problem to designers since it is classically traded against common-mode rejection. In general, a fairly high common-mode rejection is desirable in a given amplifier. However, this high common-mode rejection is only attainable through the use of cascode devices which severely limit the common-mode range.

One problem with a cascode amplifer lies in the DC bias conditions for the output circuitry and also with the input circuit that must operate rail-to-rail. The DC bias problems in the output circuit result from the particular configurations utilized in differential to single-ended conversion circuits that are presently available. One such circuit is illustrated in Laber, Rahim, Dreyer, Uehara, Kwok and Gray, "Design Considerations for a High-Performance 3-μm CMOS Analog Standard-Cell Library", *IEEE Journal of Solid-State Circuits*, Vol. SC-22, No. 2 (April 1987) pp. 181, 186. The device illustrated in this article illustrates common-mode range to only one rail.

SUMMARY OF THE INVENTION

The present invention disclosed and claimed herein comprises a folded cascode amplifier with rail-to-rail common-mode range. The amplifier comprises two folded cascode amplifiers operating in a push-pull configuration. The first amplifier has a common source circuit operable to generate a differential current to a positive rail and a second amplifier having a common source circuit for generating a differential current to the negative rail. A push-pull common gate circuit is provided for receiving one side of the two differential currents with a second common gate circuit for receiving the other side of the differential current. The two push-pull common gate circuits are connected to two output voltage terminals. Variable current loads are provided for both of the push-pull gate circuits, which have a resistance that varies as a function of a common-mode control voltage. A common-mode control circuit is provided for controlling the variable loads in the first and second common gate circuits to set up the common-mode voltage between the two output terminals. Comparator circuitry is provided for sensing the voltage on one of the output terminals and comparing it with a reference voltage and controlling the common-mode circuit to maintain the sensed output node at the reference voltage in a negative feedback loop.

A technical advantage is provided by the amplifier of the present invention in that it provides a high feedback amplification circuit which accounts for bias current changes that occur when one set of input devices is cut off. This results in a relatively low crossover distortion. Additionally, the slewing characteristics of the amplifier are similar when the common-mode range is at either supply rail. Another technical advantage is that the amplifier can operate at a relatively low supply voltage, and can be operated with a signal supply. The folded cascode architecture allows high frequency operation. A further technical advantage of the present invention is that it increases slew rate over a standard folded cascode amplifier in one direction through the use of the feedback loop provided by the comparator circuitry.

BRIEF DESCRIPTION OF THE DRAWING

For a more complete understanding of the present invention and the advantages thereof, reference is now made to the following description taken in conjunction with the accompanying drawing which illustrates a schematic diagram of the folded cascode amplifier with rail-to-rail common-mode range.

DETAILED DESCRIPTION OF THE INVENTION

Referring now to the FIGURE, there is illustrated a schematic diagram of a folded cascode amplifier with rail-to-rail common-mode input range. A supply terminal 10 is provided for connection to the supply voltage $V_{DD}$ and a source terminal 12 is provided for connection to a source voltage $V_{SS}$. A central current source 14 is connected between the terminals 10 and 12 through diode connected transistors. These diode connected transistors are comprised of two P-channel transistors 16 and 18 and two N-channel transistors 20 and 22. Transistors 16–22 have the gates thereof tied to their respective drains with transistors 16 and 18 connected in a series configuration between one terminal of the current source 14 and the supply terminal 10 and transistors 20 and 22 connected in a series configuration between the other terminal of the current source 14 and the source terminal 12.

The input leg of the amplifer has a positive input terminal 24 and a negative input terminal 26 with a voltage V+ connected to the positive terminal 24 and a voltage V− connected to the negative input terminal 26. The input circuit provides two sets of input devices to allow rail-to-rail common-mode operation. The first set of input devices is comprised of an N-channel transistor 28 having the gate thereof connected to the input terminal 24, a source thereof connected to a node 30, and a drain thereof connected through a line 29 to a node 31. An N-channel transistor 32 of this first set has its source connected to the node 30, its gate to terminal 26 and its drain through a line 33 to a node 59. A current source is provided between the node 30 and the source terminal 12, which current source is comprised of an N-channel transistor 34 having the drain thereof connected to node 30, the gate thereof connected to the gate of transistor 20 and the source thereof connected to the drain of an N-channel transistor 36. Transistor 36 has the gate thereof connected to the gate of transistor 22 and the source thereof connected to the source terminal 12. The drains of transistors 28 and 32 are connected to separate legs in an output circuit, as will be described hereinbelow.

The other set of input devices is comprised of a P-channel transistor 38 having the gate thereof connected to the positive input terminal 24, the source thereof connected to a node 40, and the drain thereof connected through a line 41 to a node 78. The other set further includes a P-channel transistor 42 having the gate thereof connected to the negative input terminal 26, the source thereof connected to the node 40, and the drain thereof connected through a line 43 to a node 64. The node 40 is connected through a current source to the supply terminal 10. The current source is comprised of a P-channel transistor 44 which has the drain thereof connected to node 40 and the source thereof connected to the drain of a P-channel transistor 46. The P-channel transistor has the source thereof connected to the supply terminal 10 with the gate of transistor 46 connected to the gate of transistor 16 and the gate of transistor 44 connected to the gate of transistor 18. The drains of transistors 38 and 42 are connected to the two output legs, as will be described hereinbelow.

The N-channel transistors 28 and 32 provide a first differential current on the drains thereof. The P-channel transistors 38 and 42 provide a second differential current on the drains thereof. Both N-channel transistors 28 and 32 and P-channel transistors 38 and 42 form common source amplifiers.

There are two output legs provided with one of the legs connected to an output terminal 48 which is labeled $V_{out}$. The other is connected to a node 50. The node 50 is connected to analog ground through a compensation capacitor 52 and node 48 is connected to analog ground through a compensation capacitor 54. It should be noted that analog ground is illustrated as an inverted triangle and is to be distinguished over the source voltage $V_{SS}$.

The first output leg connected to the output terminal 48 is comprised of two series-connected P-channel transistors 56 and 58. The transistor 56 has the source thereof connected to the supply terminal 10, the drain thereof connected to a node 59 and the gate thereof connected to the gate of transistor 16. Transistor 58 has the source thereof connected to the node 59, the drain thereof connected to the output terminal 48 and the gate thereof connected to the gate of transistor 18. The transistor 56 constitutes a current source and transistor 58 constitutes a common gate amplifier, with transistor 58 modulating or "steering" the current supplied to output terminal 48.

On the other side of the output terminal 48, two N-channel transistors 60 and 62 are connected in a series configuration between the node 48 and the source terminal 12. The transistor 60 has the drain thereof connected to the output terminal 48 and the source thereof connected to a node 64 and constitutes a common gate amplifier which, in combination with transistor 58, provides for a push-pull operation. Transistor 62 has the drain thereof connected to the node 64 and the source thereof connected to the source terminal 12. The gate of transistor 60 is connected to the gate of transistor 20 and the node 64 is connected to the drains of transistors 42 and 62. The gate of transistor 62 is connected to a node 65. Transistor 62 provides a current variable load that varies as a function of its gate bias.

The other output leg is comprised of two series connected P-channel transistors 66 and 68 connected between the supply terminal 10 and the node 50 and two series connected N-channel transistors 70 and 74 connected between the node 50 and the source terminal 12. The P-channel transistor 66 has the source thereof connected to the supply terminal 10, the drain thereof connected to node 31 and the gate thereof connected to the gate of transistor 16 to function similar to transistor 56 as a current source. Transistor 68 has the source thereof connected to the node 31, the drain thereof connected to the node 50 and the gate thereof connected to the gate of transistor 18 and operates as a common gate amplifier, similar to transistor 58.

The N-channel transistor 70 has the drain thereof connected to the node 50 and the source thereof connected to a node 78 and the gate thereof connected to the gate of transistor 20 to provide a common gate amplifier, similar to transistor 60. Transistor 74 has the drain thereof connected to the node 78, the source thereof connected to the source terminal 12 and the gate thereof connected to the gate of transistor 62. Transistor 74 operates as a current variable load, similar to transistor 62, for interface with the push-pull configured common gate transistrrs 68 and 70.

An auxiliary amplifier circuit is provided which maintains node 50 at analog ground through a feedback configuration. The auxiliary amplifier is comprised of two differentially disposed transistors, a P-channel transistor 80 and a P-channel transistor 82. Transistor 80 has the source thereof connected to a node 84, the drain thereof connected to the source terminal 12 and the gate thereof connected to the node 50. The transistor 82 has the source thereof connected to the node 84, the drain thereof connected to node 65 and the gate thereof connected to analog ground. N-channel transistor 86 has its gate and drain connected together at node 65. The source of transistor 86 is connected to the source terminal 12. A current source is provided with two series-connected P-channel transistors 88 and 90 which are connected between the supply terminal 10 and the node 84, with the gate of transistor 88 connected to the gate of transistor 16 and the gate of transistor 90 connected to the gate of transistor 18.

The operation of the amplifier of the present invention will be described hereinbelow. Initially, it will be helpful to describe the operation without considering the transistors 80 and 82–90 that make up the auxiliary amplifier. When the voltages V+ and V− are equal such that they provide a balanced condition, the current flowing through the N-channel transistors 28 and 32 and the P-channel transistors 38 and 42 is equal. However, when there is a differential voltage impressed across the input terminals 24 and 26, this current varies. For example, if the voltage on the input terminal 24 is much less than the voltage on the input terminal 26, this will result in the current flowing through transistor 28 decreasing, and the current flowing through transistor 32 increasing. However, it should be noted that the current flowing through transistor 66 to node 31 is split between the path through the source-to-drain of transistor 28 and the path through the source-to-drain of transistor 68. In the balanced condition, this is approximately equal such that one half of the current flows in either direction. However, when transistor 28 is partially turned off, this forces more current through transistor 68 and subsequently through transistor 70 and 74. In addition, more current would flow through transistor 38 since it is turned on harder and less current through transistor 42, resulting in more current supplied to node 78 and through transistor 74.

Without the auxiliary amplifier comprised by transistors 80, 86, 82, 90 and 88, the circuit would probably be reconfigured as follows. The gates of transistors 74 and 62 would be disconnected from node 65 and connected instead to node 50. In addition, a special biasing circuit would be required to bias the gates of devices 70 and 60, so that devices 70, 60, 74 and 62 would all operate in the saturation mode. This special biasing circuit, however, would be unable to adapt to the large changes in bias currents that occur when the common mode input signal is near either supply rail, thereby limiting the common mode range of the amplifier.

The conventional configuration as above described would not be able to adapt the biasing circuitry to operate in linear mode when the common mode input signal is at the negative rail. In this condition, N-channel transistors 28 and 32 are turned off, while P-channel transistors 38 and 42 remain turned on. All current flowing from transistor 66 flows through transistors 68, 70 and 74. In a similar manner, all current flowing through transistor 56 would flow through transistors 58, 60 and 62. Transistors 74 and 62 are designed to operate in saturation with approximately the same current that flows through transistors 66 and 56. Dumping all of the current from transistors 66, 56, 38 and 42 through respective transistors 74 and 62 drives these last transistors into the triode mode of operation, such that transistors 74 and 62 no longer behave in a linear fashion. This in turn raises the voltage on node 78 and therefore, node 50. Raising the voltage at node 50 will eventually force transistor 68 into the triode mode of operation such that it will no longer operate properly. The amplifier would therefore no longer amplify the signal in a linear fashion.

Returning to the circuit of the invention as shown in the FIGURE, the two sets of input devices, the N-channel devices 28 and 32 and the P-channel devices 38 and 42, provide a rail-to-rail common-mode input range by allowing variations in the bias current that occur when one set of the input devices is cut off. For example, the inputs 24 and 26 may both be at the negative rail, shutting off transistors 28 and 32. Whereas in the usual case approximately one half the current flows through transistor 66 into line 29 and through transistor 28, all of the current flowing through transistor 66 will instead pass through transistors 68, 70 and 74. In a like manner, all current sourced through transistor 56 will pass through transistors 58, 60 and 62. As explained previously, transistors 74 and 62 are not designed to respond in a linear fashion to currents of this magnitude, and are forced into triode operation. Nodes 78 and 64 are therefore forced high. The high voltage at node 78 translates to a raise voltage at node 50. The raised voltage at node 50 causes transistor 80 to decrease the current flow therethrough. Instead, more current flows through transistor 82 back to node 65. The high voltage at node 65 tends to turn on transistor 86, which is mirrored at the gates of transistors 62 and 74. In essence, a negative feedback is provided to turn on transistors 74 and 62 harder, such that they will behave in a linear fashion even with increased bias currents.

In the reverse situation where inputs 24 and 26 are at the positive rail, transistors 28 and 32 are turned on and transistors 38 and 42 are turned off. In this instance, one half of the current through transistor 66 is diverted through line 29 and transistor 24, and one half of the current flowing through transistor 56 is drawn through line 33 and transistor 32. Meanwhile, no current reaches transistor 74 through line 41 from P-channel transistor 38, and no current is received at node 64 through line 43 from P-channel transistor 42. Therefore, transistors 74 and 62 will no longer be properly biased. Since current flowing to nodes 78 and 64 has been reduced, these nodes will experience a lower voltage. Lowering the voltage at node 78 translates into a lower voltage at node 50. This in turn will have a tendency to turn P-channel transistor 80 on and divert more current through it than through transistor 82. The voltage at node 65 will therefore drop, and less voltage will therefore appear at the gates of transistors 86, 62 and 74. This adjustment will make sure that transistors 74 and 62 operate in a linear fashion even with reduced bias current.

When the auxiliary amplifier is connected, it provides a feedback circuit to maintain the node 50 at analog ground. For example, if node 50 begins to rise, due to the relatively lower voltage on the input terminal 24, this would cause transistor 80 to begin to turn off and more current would flow through transistor 82 to node 65 and to transistor 86. This would slightly pull up the gate of transistor 86 which would be reflected over to the gate of transistor 74. Since transistor 74 has a gate voltage that is independent of the drain voltage, this would cause more current to flow through transistor 74, thus pulling more current through transistor 70 and lowering the voltage on node 50.

In the reverse situation, if the voltage on node 50 were to fall below analog ground, this would turn transistor 80 on harder and cause more current to flow through transistor 80 and less current to flow through transistor 82. This would result in the voltage on the gate to drain of transistor 86 falling, thus turning off transistor 74 to decrease the current being pulled to transistor 70 to allow the node 50 to increase in voltage. This provides the feedback for the circuit of the present invention. Therefore, the auxiliary amplifier works by always adjusting the Class A bias current in the double-ended to single-ended converter to hold the node 50 at analog ground. In other respects, the overall amplifier functions as a standard folded-cascode amplifier.

One advantage of the amplifier of the present invention is that it provides a high feedback amplification circuit which accounts for bias current changes that occur when one set of input device is cut off. This results in a relatively low crossover distortion. Additionally, the slewing characteristics of the amplifier are similar when the common-mode range is at either supply rail. Another feature is that the amplifier can operate at relatively low supply voltages and, in spite of the extensive use of cascodes, the amplifier can be utilized with a single supply. By utilizing the folded cascode architecture of the present amplifier, high frequency operation is achieved.

The amplifier of the present invention has an additional advantage in that current is boosted through transistor 86 and the auxiliary amplifier during negative slewing of the amplifier. This provides an increase in the slew rate of the amplifier in the negative direction. In the preferred embodiment, the bias current through transistors 88 and 90 is designed to be twice the current through either transistor 66 or transistor 56. Therefore, the auxiliary amplifier carries twice the current as the remaining legs in the output circuit. When there is a negative transition, this causes transistor 86 to boost the current in transistor 62 by a factor of two, resulting in the increased slew rate. Although the auxiliary amplifier is illustrated with the use of N-channel transistors, it should be understood that a P-channel transistor technology could be utilized with the result that the amplifier would then have an increased slew rate in the positive direction.

In fact, auxiliary amplifiers other than the one described could be used, including level shifter circuits. The basic function of the auxiliary amplifier of the invention is to couple the push-pull cascode devices 68, 70, 58 and 60 to the current-variable loads 74 and 62 with negative feedback such that the cascode devices remain in linear operation even where large variations in load current are experienced due to rail-to-rail common mode operation. Any amplifier or level shifter accomplishing this function may be used.

In summary, there has been provided a folded cascode amplifier with a fully differential input and a single ended output. The amplifier has an input that operates with a rail-to-rail common-mode range with an output that tracks the input over the entire common-mode range without destroying the D.C. bias characteristics of the output. The output circuit utilizes a feedback network to maintain one terminal on the output at analog ground by controlling current variable loads for the common gate position of the amplifier with the feedback circuit.

Although the present invention has been described in detail, it should be understood that various changes, substitutions and alterations can be made therein without departing from the spirit and scope of the invention as defined by the appended claims.

What is claimed is:

1. A folded cascode differential amplifier with rail-to-rail common-node range, comprising:
   a positive supply rail;
   a negative supply rail;
   first common source circuitry for converting a differential input voltage to a first differential current and operable to said positive rail;
   second common source circuitry for converting said input voltage to a second differential current and operable with a common-node range to said negative rail;
   a plurality of first push-pull cascade devices for receiving on an input one side of each of said first and second differential currents for conversion to a voltage on a first output node;
   a plurality of second push-pull cascade devices for receiving on an input one side of each of said first and second differential currents for conversion to a voltage on a second output node;
   a first current variable load for varying the current through said first ascode devices to vary the voltage on said first output node;
   a second current variable load for varying the current through said second cascode devices to vary the voltage on said second output node; and
   a negative-feedback auxiliary amplifier coupled to said cascode devices and said current variable loads, said auxiliary amplifier operable to maintain said cascode devices in linear operation while permitting variations in load current resulting from rail-to-rail common mode operation.

2. A folded cascode amplifier with rail-to-rail common-mode range, comprising:
   a positive supply rail;
   a negative supply rail;
   a reference voltage;
   first common source circuitry for converting a differential input voltage to a first differential current and operable with a common-mode range to said positive rail;
   second common source circuitry for converting said input voltage to a second differential current and operable with a common-mode range to said negative rail;
   first push-pull common gate circuitry for receiving on an input one side of each of said first and second differential currents for conversion to a voltage on a first output node;
   second push-pull common gate circuitry for receiving on an input one side of each of said first and second differential currents for conversion to a voltage on a second output node;
   a first current variable load for varying the current through said first common gate circuitry to vary the voltage on said first output node;
   a second current variable load for varying the current in said second common gate circuitry to vary the voltage on said second output node;
   control circuitry for controlling said first and second current variable loads to set the common-mode voltage between said first and second output nodes; and
   comparator circuitry for comparing the voltage on said first output node with said reference voltage and controlling said control circuitry to maintain said first output node at said reference voltage in a negative feedback loop.

3. The folded cascode amplifier of claim 2 wherein said first common source circuitry comprises a differential common source amplifier comprising:
   a current source disposed between a node and the said negative supply rail; and
   a pair of differentially connected N-channel transistors having the gates thereof connected between said differential input and the source-to-drain paths thereof each connected on one side thereof to said node for providing said first differential current on the other side of the source-to-drain paths from said node, the current proportional to the differential voltage on the gates of said transistors.

4. The folded cascode amplifier of claim 3 wherein said second common source circuitry comprises:
   a current source connected between said positive supply rail and a second node; and
   a pair of differentially configured P-channel transistors having the source-to-drain paths thereof connected on one side thereof to said second node and the other side of the source to drain path for providing said second differential current;
   the gates of said P-channel transistors connected between said differential input voltage.

5. The folded cascode amplifier of claim 2 wherein said first and second variable loads each comprise an N-channel MOS transistor connected in series with the associated one of said first and second push-pull common gate circuitry and said negative supply rail, wherein said control circuitry controls the gate bias on said N-channel transistors.

6. The folded cascode amplifier of claim 5 wherein said control circuitry comprises an N-channel transistor having the gate and drain thereof connected together in a diode configuration and the source thereof connected to said negative supply rail with the diode connected gate and drain thereof connected to the gates of said N-channel transistors in said first and second current variable loads to control the current therethrough.

7. The folded cascode amplifier of claim 6 wherein said comparator circuitry comprises:
   a current source connected between said positive supply rail and a comparator node;
   a pair of differentially configured P-channel transistor having the source-to-drain path thereof connected on one side thereof to said comparator node and the gate of one of said transistors connected to said first output node and the gate of the other of said transistor connected to said reference voltage;
   the one of said transistors having the gate thereof connected to said first output node having the other end of the source-to-drain path thereof connected to said negative supply rail and the other end of the souce-to-drain path of the other of said transistors being connected to the drain of said diode configured transistor.

8. The folded cascode amplifier of claim 2 wherein said reference voltage comprises analog ground.

9. The folded cascode amplifier of claim 2 wherein:
   said first push-pull common gate circuitry comprises first and second common gate amplifiers each having an output connected to said first output node, said first common gate amplifier having an input connected to the output of a first current source and to a first output of said first common source circuitry, said second common gate amplifier having an input connected to an outpput of said first current variable load and to a first output of said second common source circuitry; and wherein
   said second push-pull common gate circuitry comprises third and fourth common gate amplifiers each having an output connected to said second output node, said third common gate amplifier having an input connected to the output of a second current source and to a second output said first common source circuitry, said fourth common gate amplifier having an input connected to an output of said second current variable load and to a second output of said second common source circuitry.

10. A folded cascode amplifier with rail-to-rail common-mode range, comprising:
    a positive supply rail;
    a negative supply rail;
    a first common source differential amplifier for converting a differential input voltage to a first differential current and operable with a common-mode range to said positive rail;
    a second differential common source amplifier for converting said input voltage to a second differential current and operable with a common-mode range to said negative rail;
    a first push-pull common gate circuit for receiving on an input thereof one side of each of said first and second differential currents for conversion to a voltage on a first output node, said first push-pull common gate circuit having a first current variable load that varies in response to an external signal;
    a second push-pull common gate circuit for receiving on an input thereof the opposite side of each of said first and second differential currents for conversion to a voltage on a second output node, said second common gate circuit having a second current variable load for varying the current in response to said external signal;
    control circuitry for generating said external signal to control the current through said first and second current variable loads to control the common-mode level of the voltage between said first and second output nodes; and
    a comparator for comparing the voltage on said first output node with analog ground and generating an error signal when the voltage on said first output node varies from analog ground, said error signal input to said control circuitry to provide a negative feedback loop such that the common-mode voltage between said first and second output nodes is varied to maintain said first output node voltage proximate to analog ground.

11. The folded cascode amplifier of claim 10 wherein said first and second current variable loads comprise N-channel transistors having one end of the source-to-drain paths thereof connected to said negative supply rail and the gates thereof for being connected to said external signal.

12. The folded cascode amplifier of claim 11 wherein said control circuitry comprises a diode connected N-channel transistor having the source thereof connected to the negative supply rail, the gate thereof connected to the drain thereof with the drain thereof connected to said error signal such that the drain thereof provides said external signal.

13. The folded cascode amplifier of claim 12 wherein said comparator comprises:
    a current source connected between said positive supply rail and a comparator node;
    a first differential P-channel transistor having a source-to-drain path connected between said comparator node and said negative supply rail and the gate thereof connected to said first output node; and
    a second differential P-channel transistor having the source-to-drain path thereof connected between said comparator node and the drain of said diode connected transistor and the gate thereof connected to analog ground.

* * * * *